United States Patent
Tatsumi et al.

(10) Patent No.: US 6,884,708 B2
(45) Date of Patent: *Apr. 26, 2005

(54) METHOD OF PARTIALLY PLATING SUBSTRATE FOR ELECTRONIC DEVICES

(75) Inventors: Kohei Tatsumi, Kawasaki (JP); Kenji Shimokawa, Kawasaki (JP); Eiji Hashino, Kawasaki (JP)

(73) Assignee: Nippon Steel Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/254,118
(22) PCT Filed: Aug. 27, 1997
(86) PCT No.: PCT/JP97/02988
§ 371 (c)(1),
(2), (4) Date: May 19, 1999
(87) PCT Pub. No.: WO98/09328
PCT Pub. Date: Mar. 5, 1998

(65) Prior Publication Data
US 2001/0012683 A1 Aug. 9, 2001

(30) Foreign Application Priority Data
Aug. 27, 1996 (JP) .............................. 8-244268

(51) Int. Cl.⁷ ............................ H01L 21/44; H05K 3/34
(52) U.S. Cl. ............................ 438/612; 29/839; 29/840
(58) Field of Search ............................ 438/612, 613, 438/615, 616; 29/839, 840

(56) References Cited

U.S. PATENT DOCUMENTS

| | | | | |
|---|---|---|---|---|
| 4,980,240 A | * | 12/1990 | Dunaway et al. | 438/613 |
| 5,492,266 A | * | 2/1996 | Hoebener et al. | 228/248.1 |
| 5,687,901 A | * | 11/1997 | Hoshiba et al. | 438/613 |
| 5,762,258 A | * | 6/1998 | Le Coz et al. | 29/840 |
| 5,765,744 A | * | 6/1998 | Tatumi et al. | 228/254 |

FOREIGN PATENT DOCUMENTS

| | | | |
|---|---|---|---|
| EP | 582375 | * | 2/1994 |
| JP | 52-115176 | | 9/1977 |
| JP | 61-014913 | | 4/1986 |
| JP | 63232360 | * | 9/1988 |
| JP | 2-278831 | * | 11/1990 |
| JP | 3-124091 | | 5/1991 |
| JP | 4-65130 | * | 3/1992 |
| JP | 5-129374 | | 5/1993 |
| JP | 7-302872 | | 11/1995 |

* cited by examiner

Primary Examiner—Alonzo Chambliss
(74) Attorney, Agent, or Firm—Kenyon & Kenyon

(57) ABSTRACT

The object of the present invention is to provide a free and precise control of the plating amount while easily determining a selected portion to be plated.

Small balls 24 are arranged at, and adhered or bonded to, via holes 22 of a TAB tape 21 and the small balls 24 are then melted so that a copper wiring 23 exposed at the via holes 22 of the TAB tape 21 can be selectively plated with a different metal to enable selected portions of a substrate for electronic devices to be partially plated easily and precisely.

10 Claims, 3 Drawing Sheets

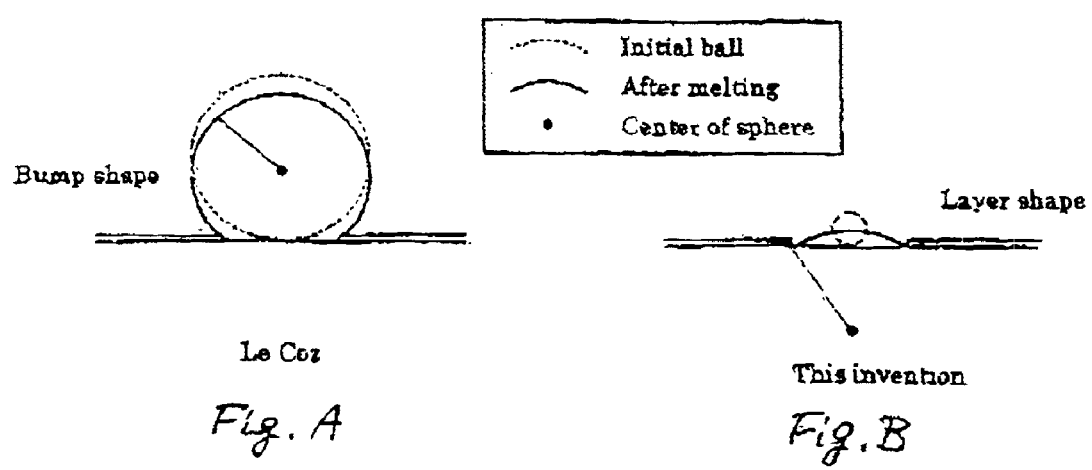

METHOD OF PARTIALLY PLATING SUBSTRATE FOR ELECTRONIC DEVICES

TECHNICAL FIELD

The present invention relates to a method of partially plating a substrate for electronic devices, and is particularly suited to a method of partially plating selected portions, selectively, on a substrate for electronic devices on which semiconductor products are to be mounted.

BACKGROUND ART

In order to protect metallic portions of a substrate for electronic devices and easily bond the substrate to other electronic devices, selected portions of the metallic portions have heretofore been partially plated. There are various types of plating methods, and typical plating methods are wet electroplating and electroless plating.

Wet electroplating is conducted by covering or masking portions other than selected portions in advance, and partially plating the selected portions. Wet electroplating, therefore, has the following problems: application to fine portions on a substrate for electronic devices on which semiconductor products are to be mounted is not suitable; and control of the plating amount is difficult.

Moreover, wet plating has another problem in that plating cannot be performed unless the article to be plated is made electrically conductive. Furthermore, since wet electroplating uses large amounts of solutions such as a plating solution and a cleaning solution, it requires a large scale treating facility, which tends to cause an environmental problem.

On the other hand, since the electroless plating is conducted with chemicals such as an acid or an alkali without utilizing electrolytic reactions, there arises the problem that the metals which can be used for plating are restricted.

Furthermore, in order to plate selected portions alone, the selected portions must be subjected to surface treatment; therefore, electroless plating has the problem that it requires many elaborate procedures. Still furthermore, electroless plating has disadvantages in that it is difficult to form a thick plated layer and that the plating amount varies.

DISCLOSURE OF INVENTION

In view of the problems as mentioned above, the object of the present invention is to provide free control of the plating amount while easily determining a selected portion to be plated.

A method of partially plating a substrate for electronic devices according to the present invention comprises arranging small balls at selected portions of a substrate for mounting semiconductor devices thereon, or a substrate for mounting electronic devices thereon and including a lead frame, and adhering or bonding the small balls thereto, and melting the small balls, thereby selectively plating the selected portions of the substrate for electronic devices with a different metal.

Moreover, the method of partially plating a substrate for electronic devices according to the present invention is characterized by that the method comprises provisionally arranging and holding the small balls on an arrangement base plate having through holes provided at positions corresponding to the portions to be plated of the substrate for electronic devices, transferring the arrangement base plate above the substrate for mounting electronic devices, and adhering or bonding the small balls provisionally arranged at and held by the through holes to the portions to be plated, respectively.

Furthermore, in the provisionally arranging and holding procedure, excess small balls adhering to the arrangement base plate or the small balls which are provisionally held by the substrate are removed by applying vibrations to the arrangement base plate, thereby provisionally arranging and holding the small balls.

Moreover, the vibrations are ultrasonic vibrations.

The present invention is further characterized in that the small balls are selected from solder, Sn alloy or In alloy, and that the selected small balls are melted by reflowing to selectively plate the selected portions of the substrate for electronic devices with a different metal.

Moreover, the present invention is characterized in that the small balls are selected from Au, Ag, Pd, Pt, Ni or Cr, and that the balls are melted by partial heating.

The present invention is further characterized in that the substrate for electronic devices is an insulating resin substrate or a polyimide tape, and that the selected portions are wiring composed of copper.

Furthermore, the present invention is characterized in that the substrate for electronic devices is made of a ceramic material, and that the selected portions are wiring composed of copper.

Still furthermore, the present invention is characterized in that the substrate for electronic devices is a lead frame composed of copper or iron alloy, and that the leads of the lead frame are partially plated.

Since the present invention comprises the technological means as mentioned above, metal balls provisionally arranged at selected portions of a substrate for electronic devices are melted, and as a result the metal balls are thermally diffused to produce firm adhesive force with the substrate metal. Since the metal balls are bonded to the substrate metal by thermal diffusion, it is desirable that the metal balls be excellent in bonding caused by diffusion.

In addition, when a combination of the ball metal and the substrate metal shows a poor bonding force, or when the diffusion rate of the ball metal is too large, it is preferred to allow a metal different from the substrate metal and the ball metal to intervene between both metals.

BEST MODE FOR CARRYING OUT THE INVENTION

One embodiment of the method of partially plating a substrate for electronic devices of the present invention will be explained below with reference to drawings.

Figure 1:
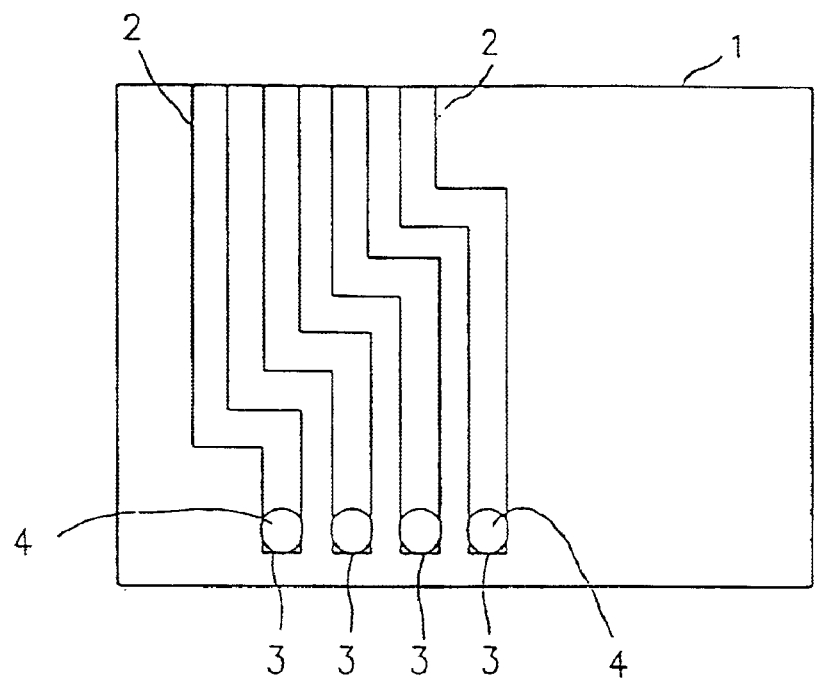
FIG. 1 shows a first embodiment of the present invention, and is a plan view of a glass-epoxy substrate which has leads of copper wiring formed thereon.

FIG. 1 shows a first embodiment of the present invention, and is a view for illustrating partial plating of selected portions (ends) 3 of leads of copper wiring 2 on a glass-epoxy substrate 1.

The leads of copper wiring 2 in FIG. 1 have a wiring width of 50 $\mu$m. Balls 4 used for partially plating the selected portions 3 are solder balls, and have a diameter of 60 μm (eutectic solder).

When the method of partially plating the substrate for electronic devices in the present embodiment is carried out, firstly, the balls 4 are provisionally arranged at the ends 3 of the leads of copper wiring 2 on the glass-epoxy substrate 1.

Next, the balls 4 are reflowed at 290° C. so that the selected portions 3 of the leads of copper wiring 2 are plated with the balls 4 to achieve solder plating.

Next, a procedure of provisionally arranging the balls 4 at the ends 3 of the leads of copper wiring 2 will be explained with reference to FIGS. 2(a), 2(b).

Figure 2:
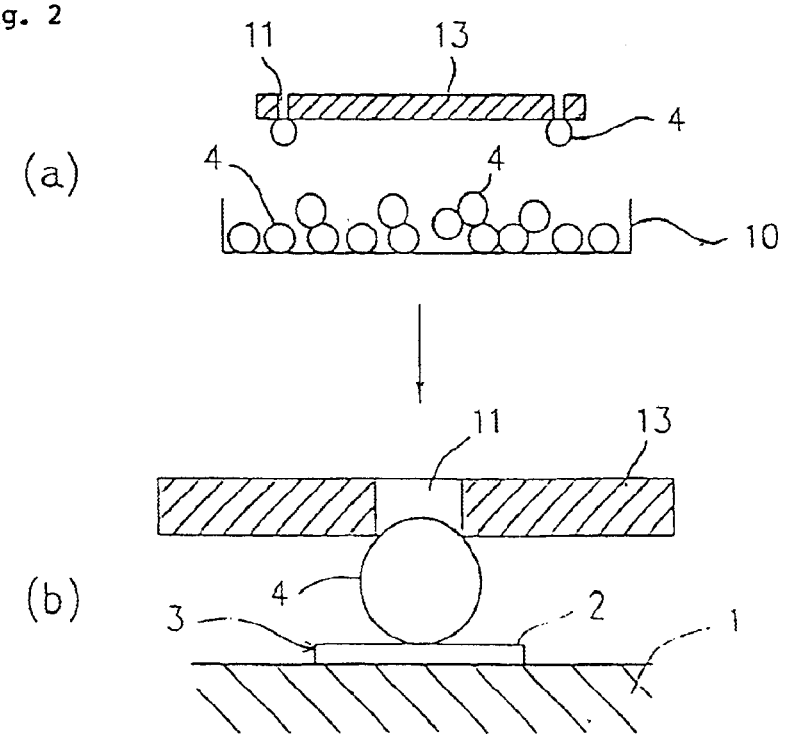
FIGS. 2(a), 2(b) are views for illustrating the arrangement of small balls.

As shown in FIGS. 2(a), 2(b), the balls 4 are arranged in the following manner. The back side of a 0.3 mm thick arrangement base plate 13 having holes 11, which have a diameter of 40 μm, pierced through the plate at positions corresponding to the selected portions 3 of the leads of copper wiring 2 formed on the glass-epoxy substrate 1 is attracted by suction by applying a vacuum pressure (attracting mechanism not shown). The arrangement base plate 13 is brought close to a container 10 accommodating the balls 4 while the attracted state is being maintained.

The balls are attracted by suction and held at the respective holes 11. Excess balls adhere to portions other than the holes 11 of the arrangement base plate 13, or other excess balls adhere to the balls 4 attracted by suction to the holes 11 during attracting the balls by suction; therefore, the excess balls must be removed. In order to remove the excess balls, an arbitrary procedure such as a procedure in which vibrations are applied can be utilized. For example, the excess balls can be preferably removed by applying ultrasonic vibrations to the arrangement base plate 13 in the horizontal direction.

The selected portions 3 of the leads of copper wiring 2 and the holes 11 of the arrangement base plate 13 are subsequently relatively moved so that the holes 11 are located in correspondence with the selected portions 3, respectively, and the balls 4 are provisionally adhered to the selected portions 3 of the leads of copper wiring 2, respectively. The balls 4 are then melted by reflowing and are bonded to the selected portions 3 of the leads of copper wiring 2 as explained above.

Next, a second embodiment of the method of partially plating a substrate for electronic devices of the present invention will be explained with reference to FIG. 3.

In the second embodiment, via holes 22 of a TAB tape 21 are plated with solder.

Figure 3:
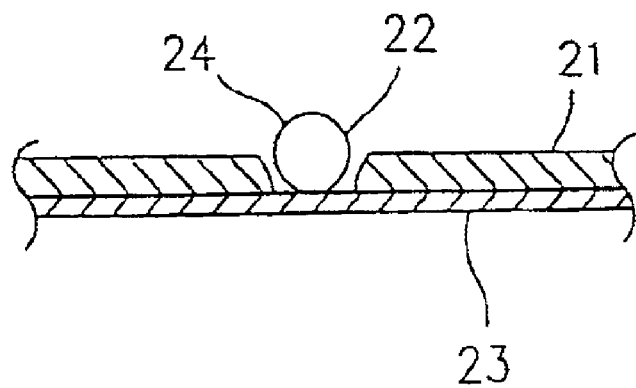
FIG. 3 shows a second embodiment of the present invention, and is a view illustrating a method of partially plating via holes of a TAB tape with solder.

As shown in FIG. 3, small balls 24 are provisionally arranged on copper (Cu) wiring 23 exposed at a plurality of the via holes 22 formed at given positions of the TAB tape 21. In this case, the via holes 22 have a diameter of 100 μm, and the small balls 24 have a diameter of 60 μm. The number of the via holes 22 is, for example, about 300, and they are formed as one unit in a lattice-like form.

When a plurality of the small balls 24 are provisionally arranged as explained above, they are subsequently reflowed, whereby the copper (Cu) wiring 23 exposed at the via holes 22 can be plated with solder easily and precisely.

Therefore, according to the method of partial plating in the present embodiment, wiring having a melting point lower than that of the TAB tape 21 can be formed at the via holes 22. As a result, the copper (Cu) wiring 23 exposed in the via holes 22 of the TAB tape 21 and the electrodes of a semiconductor chip (not shown in the figure) can be bonded together at low temperature. It becomes, therefore, possible to arrange electrodes in an area array-like form on an insulating tape.

Accordingly, the method of partially plating a substrate for electronic devices of the present embodiment is very favorable to the bonding of multi-pins. Moreover, since the TAB tape 21 and the small balls 24 can be bonded together collectively using the arrangement base plate 13, the method can greatly improve the productivity of a large range of high density devices having a number of electrodes.

Figure 4:
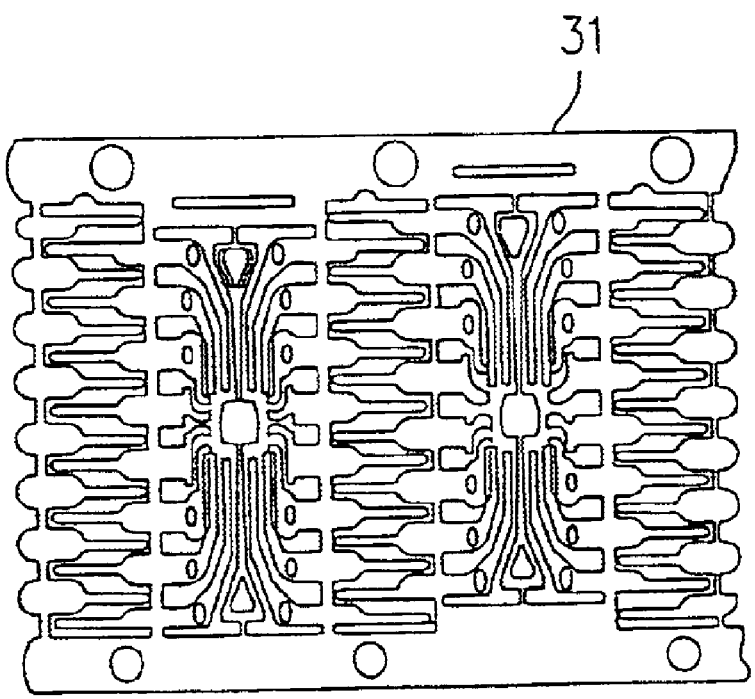
FIG. 4 shows a third embodiment of the present invention, and is a view illustrating an example of a lead frame.

Next, a third embodiment of the present invention will be explained with reference to FIG. 4.

In the third embodiment, the method of partial plating is applied to plating only the leads of a lead frame 31 with silver.

In the present embodiment, a silver ball (not shown in the figure) having a diameter of 150 μm is arranged at the end of each of the lead electrodes having a lead width of 150 μm, and provisionally adhered to the end. The silver ball is then spot-irradiated with a laser beam to be melted so that the end of the lead electrode is plated therewith.

Since partial plating is conducted as explained above in the method of partial plating in the present embodiments, selected portions of a substrate for electronic devices can be selectively plated with a different metal efficiently, and the plating amount can be controlled precisely.

That is, balls are arranged at selected portions of a substrate for electronic devices in the following manner. The back side of an arrangement base plate having holes formed at positions corresponding to the selected portions is attracted by suction by applying a vacuum pressure, whereby the balls are attracted by suction to and held by the holes, respectively. For example, about 300 balls can be arranged collectively.

Moreover, the plating amount of a selected portion can be controlled easily and precisely by adjusting the size of the ball. Furthermore, any metal can be used for plating so long as preparation of small balls of the metal is possible. The plating method also has an advantage of causing no environmental problem at the time of plating. Still furthermore, the partial plating method of the present embodiments can be easily applied to plating two or more different layers in lamination.

INDUSTRIAL APPLICABILITY

As explained above, small balls are provisionally arranged at portions to be plated, and melted so that the portions are plated with the metal in the present invention. Accordingly, the present invention markedly improves the plating efficiency compared with conventional procedures where plating is conducted by depositing metal on an atomic or molecular scale.

Moreover, since the selectivity of portions to be plated is excellent, desired positions can be freely plated without conducting procedures such as masking portions not to be plated, and the plating operation can be greatly rationalized.

Moreover, the present invention has excellent advantages such as explained below. The plating amount can be easily and precisely controlled by adjusting the size of the balls. Furthermore, there is no fear of fouling the substrate for electronic devices and plating can be conducted without environmental pollution because no plating solutions are used.

What is claimed is:

1. A method of partially plating a substrate for electronic devices, comprising arranging metal balls having a diameter of 60 to 150 μm at selected portions of a substrate for mounting electronic devices thereon, said selected portions having a width not less than the diameter of said metal balls, and adhering or bonding the metal balls thereto, and melting the metal balls to form a plated layer thermally diffused with the substrate, thereby selectively plating the selected portions of the substrate for electronic devices with a different metal with no plating solutions used.

2. The method of partially plating a substrate for electronic devices as claimed in claim 1, wherein the method comprises provisionally arranging and holding the metal balls on a surface of an arrangement base plate having through holes provided at positions corresponding to the portions to be plated of the substrate for electronic devices, with said surface of said arrangement base plate facing downward during said provisionally arranging and holding procedure, transferring the arrangement base plate above the substrate for mounting electronic devices, and adhering or bonding the metal balls provisionally arranged at and held by the through holes to the portions to be plated, respectively.

3. The method of partially plating a substrate for electronic devices as claimed in claim 2, wherein, in the provisionally arranging and holding procedure, excess metal balls adhering to the arrangement base plate or the metal balls which are provisionally held by the arrangement base plate are removed by applying vibrations to the arrangement base plate, thereby provisionally arranging and holding the metal balls.

4. The method of partially plating a substrate for electronic devices as claimed in claim 3, wherein the vibrations are ultrasonic vibrations.

5. The method of partially plating a substrate for electronic devices as claimed in claim 1, wherein the metal balls are selected from Au, Ag, Pd, Pt, Ni or Cr, and balls are melted by partial heating.

6. The method of partially plating a substrate for electronic devices as claimed in claim 1, wherein the substrate for electronic devices is an insulating resin substrate or a polyimide tape, and the selected portions are wiring composed of copper.

7. The method of partially plating a substrate for electronic devices as claimed in claim 1, wherein the substrate for electronic devices is made of a ceramic material, and the selected portions are wiring composed of copper.

8. The method of partially plating a substrate for electronic devices as claimed in claim 1, wherein the substrate for electronic devices is a lead frame composed of copper or iron alloy, and the leads of the lead frame are partially plated.

9. The method of partially plating a substrate for electronic devices as claimed in claim 1, wherein the metal balls are solder, and the metal balls are melted by reflowing to selectively plate the selected portions of the substrate for electronic devices and with a layer of a metal different from a substrate metal and the ball metal, the layer intervening between the substrate and the plated layer formed by reflowing the metal balls.

10. The method of partially plating a substrate for electronic devices as claimed in claim 1, wherein the metal balls are selected from Sn alloy or In alloy and the selected metal balls are melted by reflowing to selectively plate the selected portions of the substrate for electronic devices with a different metal.

* * * * *